United States Patent
Goldstein et al.

[11] Patent Number: 6,146,541
[45] Date of Patent: Nov. 14, 2000

[54] METHOD OF MANUFACTURING A SEMICONDUCTOR DEVICE THAT USES A CALIBRATION STANDARD

[75] Inventors: Laurie A. Goldstein, Scottsdale; Timothy J. Warfield, Gilbert; Jane K. Gates, Chandler; Elizabeth Apen, Scottsdale, all of Ariz.

[73] Assignee: Motorola, Inc., Schaumburg, Ill.

[21] Appl. No.: 08/848,849

[22] Filed: May 2, 1997

[51] Int. Cl.⁷ .................................................. H01L 21/302
[52] U.S. Cl. .................... 216/2; 216/55; 216/79; 216/80; 438/14; 438/906; 134/1.3; 134/902
[58] Field of Search .................... 438/5, 14, 795, 438/906, 981, 723, 724; 134/1, 1.3, 902; 216/2, 55, 63, 79, 80

[56] References Cited

U.S. PATENT DOCUMENTS

| | | | |
|---|---|---|---|
| 3,969,164 | 7/1976 | Cho et al. ................................. 148/175 |
| 4,760,437 | 7/1988 | Denker et al. ............................ 357/30 |
| 4,886,765 | 12/1989 | Chen et al. ............................... 437/200 |
| 4,948,937 | 8/1990 | Blank et al. ............................. 219/121.6 |
| 4,999,211 | 3/1991 | Duggan ..................................... 427/8 |
| 5,024,968 | 6/1991 | Engelsberg ............................... 134/1.3 |
| 5,178,682 | 1/1993 | Tsukamoto et al. .................... 118/722 |
| 5,275,687 | 1/1994 | Choquette et al. ......................... 134/1 |
| 5,383,018 | 1/1995 | Sadjadi .................................... 356/243 |
| 5,534,491 | 7/1996 | Nakamura et al. ...................... 505/500 |
| 5,599,464 | 2/1997 | Laird et al. ................................. 216/2 |
| 5,611,855 | 3/1997 | Wijaranakula ............................... 117/2 |
| 5,638,251 | 6/1997 | Goel et al. ................................. 361/313 |
| 5,714,036 | 2/1998 | Wong et al. ........................... 156/626.1 |
| 5,786,277 | 7/1998 | Yamamoto ................................ 438/770 |
| 5,817,581 | 10/1998 | Bayer et al. .............................. 438/770 |
| 5,869,405 | 2/1999 | Gonzalez et al. ........................ 438/770 |
| 5,925,421 | 7/1999 | Yamazaki et al. ....................... 427/534 |
| 5,938,854 | 8/1999 | Roth .......................................... 216/67 |
| 5,950,071 | 9/1999 | Hammond et al. ...................... 438/115 |
| 5,960,255 | 9/1999 | Bartha et al. .............................. 438/14 |
| 5,998,305 | 12/1999 | Holmer et al. ............................ 134/1.3 |
| 6,013,980 | 1/2000 | Goel et al. ................................ 313/495 |

FOREIGN PATENT DOCUMENTS

| | | |
|---|---|---|
| 62-43119 | 2/1987 | Japan . |
| 1-56887 | 3/1989 | Japan . |
| 6-103573 | 4/1994 | Japan . |
| 9-092639 | 4/1997 | Japan . |
| 10-223605 | 8/1998 | Japan . |

OTHER PUBLICATIONS

Zapka, W. et al, "Efficient pulsed laser removal of 0.2 um sized particles from a solid surface" Appl. Phys. Lett. 58 (20) 2217–2219, May 1991.

*Primary Examiner*—Randy Gulakowski
*Assistant Examiner*—Anita Alanko
*Attorney, Agent, or Firm*—Robert F. Hightower

[57] ABSTRACT

A semiconductor wafer (11) having a dielectric layer (12) is used as a calibration standard (10) to calibrate thickness measuring equipment in a wafer processing or manufacturing area. The thickness of the dielectric layer (12) is maintained to a desired thickness by heating the calibration standard (10) to remove contaminants from the dielectric layer (12).

4 Claims, 1 Drawing Sheet

METHOD OF MANUFACTURING A SEMICONDUCTOR DEVICE THAT USES A CALIBRATION STANDARD

BACKGROUND OF THE INVENTION

The present invention relates, in general, to manufacturing processes, and more particularly, to methods of calibrating manufacturing equipment.

In the past, various techniques have been utilized to maintain the accuracy of equipment used to manufacture semiconductor devices, such as equipment used to measure the thickness of dielectric layers formed on semiconductor wafers. One particular calibration technique is to utilize a semiconductor wafer having a known dielectric thickness formed thereon as a calibration standard. Periodically, the dielectric layer on the calibration standard is measured by the manufacturing equipment that is in use in the manufacturing area. Any variance in the measurements on the calibration standard from the known dielectric thickness on the calibration standard is assumed to be error or drift in the manufacturing equipment. The manufacturing equipment is then corrected either by repair or adjustments. Often, the manufacturing equipment has not drifted and is making accurate measurements. Consequently, the repair or adjustments result in inaccurate measurements of dielectrics in the manufacturing area thereby resulting in improperly manufactured semiconductor devices and increased manufacturing costs.

Accordingly, it is desirable to have a manufacturing method that provides accurate calibration of manufacturing equipment, that results in accurate measurements of semiconductor devices in the manufacturing area, and that reduces manufacturing costs.

DETAILED DESCRIPTION OF THE DRAWING

Figure 1:
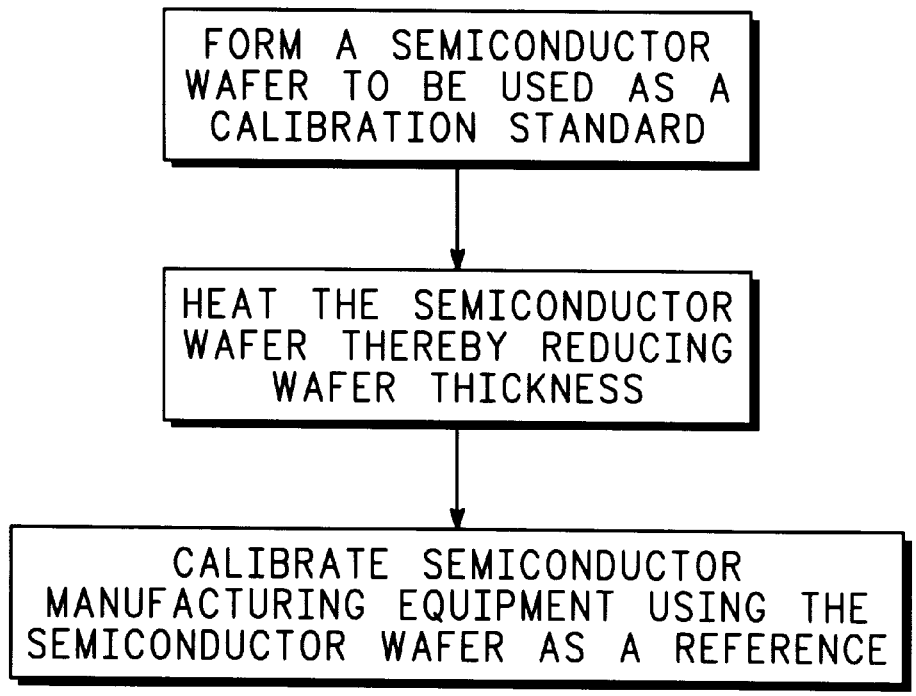
FIG. 1 is a flow chart graphically illustrating some steps in a method of manufacturing semiconductor devices in accordance with the present invention.
Figure 2:
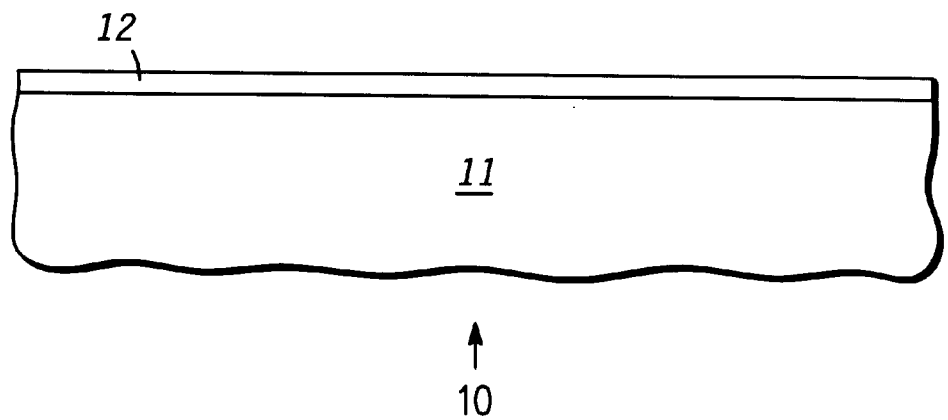
FIG. 2 illustrates a cross-sectional view of a calibration standard in accordance with the present invention.

FIG. 1 is a flow chart illustrating some of the steps in a semiconductor manufacturing method which utilizes a calibration standard that facilitates forming accurate dielectric thickness. A calibration standard 10 (see FIG. 2) is created by providing a semiconductor wafer or substrate 11 and then forming a dielectric layer 12 on the substrate. Dielectric layer 12 is formed to have a thickness that is representative of the dielectric layer thickness that will be measured by thickness measuring equipment in the manufacturing area. Thereafter, standard 10 is used as a calibration standard to calibrate the thickness measuring equipment and determine the accuracy thereof. Substrate 11 can be any of a variety of semiconductor materials including silicon, gallium arsenide, or other known semiconductor materials as long as it is the same material that is used in the manufacturing area. Dielectric layer 12 typically is a dielectric containing an oxide or nitride or combinations thereof, such as, silicon dioxide, silicon nitride, silicon oxynitride, oxides and nitrides of gallium, oxides and nitrides of silicon carbide, and transition metal oxides and nitrides (such as titanium and tantalum). Layer 12 is formed by methods well known to those skilled in the art. Typically, calibration standard 10 is retained in the wafer processing area and is used daily to calibrate the thickness measuring equipment.

It has been found that over a period of time, the thickness of a dielectric layer can increase and that this increase is a result of absorption of contaminants such as organic compounds. The contaminants have various sources in the wafer manufacturing area such as molded plastic materials for containers and other equipment, plasticizers, lubricants, and various other sources. These contaminants can result in the dielectric layer thickness increasing by fifty to sixty nanometers over a period of eight to ten hours. For thin dielectric layers, for example less than ten nanometers, the contaminates can result in a five percent increase in thickness over that time period. Using such a calibration standard with an increased dielectric thickness to calibrate thickness measuring equipment would result in inaccurate thickness measurements in the manufacturing area.

Consequently, calibration standard 10 is processed to remove the contaminants, reduce the dielectric layer thickness, and maintain the accuracy of the thickness measuring equipment. Just prior to using standard 10 to calibrate the thickness measuring equipment, standard 10 is heated in an ambient atmosphere containing either oxygen, nitrogen, an inert gas such as argon, or a mixture thereof to remove the contaminants. The heating can be accomplished with a variety of techniques well known to those skilled in the art. For example, a standard furnace used in heating semiconductor wafers can be utilized. Rapid thermal processing can also be used, or the wafer can be mounted on a hot chuck with gas flowing over the wafer. The gas typically is flowing over standard 10. The amount of gas flowing should be sufficient to insure that the gas flowing is the main component in the ambient atmosphere. It has been found that oxygen is most effective in removing the contaminants. It is believed this effectiveness is a result of the oxygen causing oxidation of some of the contaminants which cannot be volatized in a nitrogen or inert gas atmosphere.

By way of example, a silicon wafer is formed to have a ten nanometer thick silicon dioxide dielectric layer. Because the wafer was stored in a manufacturing area, the thickness of the dielectric layer increased to approximately 10.5 nanometers. Prior to using the semiconductor wafer as a calibration standard, the semiconductor wafer was heated to approximately 350° C. for ten minutes in an atmosphere having an oxygen flow of ten liters per minute. This heating operation reduced the dielectric layer thickness to approximately 10.04 nanometers, thus, maintaining the dielectric layer thickness to within 0.4 percent of the original dielectric layer thickness.

Thereafter, calibration standard 10 is used to calibrate the thickness measuring accuracy of thickness measuring equipment that is used to manufacture semiconductor wafers. Examples of such thickness measuring equipment include ellipsometers, and Time-Of-Flight Secondary Ion Mass Spectrometers. After calibration, the thickness measuring equipment is used to measure the thickness of dielectric layers on semiconductor wafers made in the manufacturing area.

By now it should be appreciated that there has been provided a novel method of maintaining a calibration standard or method of manufacturing a semiconductor device. Heating a semiconductor wafer used as a calibration standard assists in ensuring that the dielectric layer on the calibration standard has an accurately maintained thickness. The accurately maintained thickness ensures that the thickness measuring equipment accurately measures in the manufacturing area thereby reducing manufacturing costs.

What is claimed is:

1. A method of manufacturing a semiconductor device comprising:

providing a semiconductor wafer having a thickness wherein the semiconductor wafer is used as a calibration standard;

heating the semiconductor wafer in an ambient environment that includes a gas that is one of oxygen, nitrogen, or an inert gas wherein the ambient environment has an amount of the gas that is sufficient to ensure the gas is a main component of the ambient environment for removing a portion of the thickness wherein heating the semiconductor wafer to remove the portion of the thickness includes heating a dielectric layer of the semiconductor wafer to remove the portion of the dielectric layer; and using the semiconductor wafer to calibrate equipment used in manufacturing the semiconductor device.

2. A method of maintaining a calibration standard for a semiconductor wafer processing area comprising:

providing a semiconductor wafer having a dielectric layer on the semiconductor wafer, the dielectric layer having a thickness wherein the semiconductor wafer is used as a calibration standard;

heating the semiconductor wafer in an ambient environment that includes a gas that is one of oxygen, nitrogen, or an inert gas wherein the ambient environment has an amount of the gas that is sufficient to ensure the gas is a main component of the ambient environment for removing a portion of the thickness; and using the semiconductor wafer to calibrate equipment used in the semiconductor wafer processing area.

3. A method of maintaining a calibration standard for a semiconductor wafer processing area comprising:

providing a semiconductor wafer having a dielectric layer on the semiconductor wafer, the dielectric layer having a thickness wherein the semiconductor wafer is used as a calibration standard;

heating the semiconductor wafer in an ambient environment that includes a gas that is one of oxygen, nitrogen, or an inert gas wherein the ambient environment has an amount of the gas that is sufficient to ensure the gas is a main component of the ambient environment for removing a portion of the thickness; and using the semiconductor wafer to calibrate equipment used in the semiconductor wafer processing area by using the semiconductor wafer to calibrate equipment used to measure a thickness of other semiconductor wafers.

4. The method of claim 2 wherein heating the semiconductor wafer to remove the portion of the thickness includes heating the semiconductor wafer to remove the portion of the dielectric layer.

* * * * *